United States Patent
Hikichi

(10) Patent No.: US 7,459,906 B2
(45) Date of Patent: Dec. 2, 2008

(54) SEMICONDUCTOR MAGNETIC SENSOR

(75) Inventor: Tomoki Hikichi, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 12/004,158

(22) Filed: Dec. 19, 2007

(65) Prior Publication Data

US 2008/0150522 A1 Jun. 26, 2008

(30) Foreign Application Priority Data

Dec. 26, 2006 (JP) .............................. 2006-349279

(51) Int. Cl.
*G01R 33/07* (2006.01)
*G01R 33/02* (2006.01)
*H01L 43/06* (2006.01)

(52) U.S. Cl. ................... 324/251; 324/207.2; 324/249; 324/252; 257/421

(58) Field of Classification Search ............ 324/207.2, 324/249, 251–252; 257/421, 423–425, 427; 327/510–511; 365/7–9, 170

See application file for complete search history.

(56) References Cited

U.S. PATENT DOCUMENTS

| 4,739,264 | A | * | 4/1988 | Kamiya et al. ............... 324/251 |
| 5,406,202 | A | * | 4/1995 | Mehrgardt et al. .......... 324/251 |
| 5,742,080 | A | * | 4/1998 | Baranochnikov et al. .... 257/207 |
| 6,643,111 | B1 | * | 11/2003 | Motz et al. ................. 361/91.1 |
| 6,825,709 | B2 | * | 11/2004 | Motz ......................... 327/513 |

* cited by examiner

*Primary Examiner*—Bot LeDynh
(74) *Attorney, Agent, or Firm*—Adams & Wilks

(57) ABSTRACT

To detect a magnetic flux density of a magnetic field applied from an outside, a semiconductor magnetic sensor of the present invention includes: a transistor (MP101) formed on a side of one, side of a hall element (100), for driving the hall element (100), the transistor (MP101) having a drain connected to a terminal (C101) formed on the one side; a transistor (MP102) formed on the side of the one side and having a drain connected to a terminal (C102) formed on the one side; a transistor (MN101) formed on a side of another side opposite to the one side and having a drain connected to a terminal (C103) formed on the another side; a transistor (MN102) formed on the side of the another side and having a drain connected to a terminal (C104) formed on the another side.

2 Claims, 4 Drawing Sheets

SEMICONDUCTOR MAGNETIC SENSOR

This application claims foreign priority under 35 U.S.C. 119 of Japanese Patent Application No. 2006-349279, filed Dec. 26, 2006, the content of which is incorporated herein by reference in its entirety.

BACKGROUND OF THE INVENTION

1. Field of the Invention

The present invention relates to a semiconductor magnetic sensor for detecting a magnetic flux density of a magnetic field applied from an outside.

2. Description of the Related Art

At present, a hall element for magnetoelectric conversion is used as a sensor. For example, the hall element is used as a sensor for detecting opening and closing of a flip type mobile phone. The hall element of this case functions as a contactless switch.

A description is given of a semiconductor magnetic sensor having the hall element mounted therein. FIG. 4 is a plan view of a semiconductor magnetic sensor of a related art.

A terminal C301 of a hall element 300 is connected to a drain of each of transistors MP301 via a wiring N303. A terminal C302 of the hall element 300 is connected to a drain of each of transistors MP302 via a wiring N304. A terminal C303 of the hall element 300 is connected to a drain of each of transistors MN301 via a wiring N305. A terminal C304 of the hall element 300 is connected to a drain of each of transistors MN302 via a wiring N306. A source of each of the transistors MP301 and the transistors MP302 is connected to a power supply terminal N301. A source of each of the transistors MN301 and the transistors MN302 is connected to a ground terminal N302. A gate of each of the transistors MP301, the transistors MP302, the transistors MN301, and the transistors MN302 is connected to a logic circuit mounted in the same semiconductor device. In addition, the terminal C301, the terminal C302, the terminal C303, and the terminal C304 are each connected to a sampling circuit mounted in the same semiconductor device.

The hall element 300 performs magnetoelectric conversion to detect a magnetic flux density of a magnetic field of a magnet or the like, which is applied from an outside. In order to change a current path in the hall element 300, the logic circuit outputs control signals for performing on/off control of each of the transistors MP301, the transistors MP302, the transistors MN301, and the transistors MN302. The transistors MP301, the transistors MP302, the transistors MN301, and the transistors MN302 each drive the hall element 300. The sampling circuit samples a voltage generated between the terminal C301 and the terminal C303 or a voltage generated between the terminal C302 and the terminal C304.

In this case, as shown in FIG. 4, the wiring N304 is routed near the hall element 300, and the wiring N305 is also routed near the hall element 300.

Note that, as the magnetic sensor including the wirings as shown in FIG. 4, there is disclosed a technology proposed in JP 2000-147080 A.

Incidentally, magnetic fields are generated around currents flowing through the wirings according to Biot-Savart law. Those magnetic fields are interlinked with the hall element 300.

As a result, though the hall element 300 should detect only the magnetic flux density of the magnetic field of a magnet or the like, which is applied from the outside, the hall element 300 detects also the magnetic flux density of each of the magnetic fields generated by the currents flowing through the wirings. Accordingly, the semiconductor magnetic sensor does not accurately detect the magnetic flux density of the magnetic field applied from the outside.

SUMMARY OF THE INVENTION

The present invention has been made in view of the above-mentioned problems, and therefore an object of the present invention is to provide a semiconductor magnetic sensor capable of accurately detecting a magnetic flux density of a magnetic field applied from an outside.

In order to solve the above-mentioned problems, according to the present invention, there is provided a semiconductor magnetic sensor for detecting a magnetic flux density of a magnetic field applied from an outside, including: a hall element formed in one of a square shape and a rectangular shape, for performing magnetoelectric conversion; a first transistor formed on a side of one side of the hall element, for driving the hall element, the first transistor having a drain connected to a first terminal formed on the one side of the hall element and having a source connected to a power supply terminal; a second transistor formed on the side of the one side of the hall element, for driving the hall element, the second transistor having a drain connected to a second terminal formed on the one side of the hall element and having a source connected to the power supply terminal; a third transistor formed on a side of another side opposite to the one side of the hall element, for driving the hall element, the third transistor having a drain connected to a third terminal formed on the another side of the hall element and having a source connected to a ground terminal; and a fourth transistor formed on the side of the another side of the hall element, for driving the hall element, the fourth transistor having a drain connected to a fourth terminal formed on the another side of the hall element and having a source connected to the ground terminal.

According to the present invention, the transistors are formed on one side of the hall element and the drain of each of the transistors is connected to each terminal formed on the one side of the hall element. As a result, the wiring connecting the drain of each of the transistors and the hall element becomes short, whereby the magnetic fields generated due to the currents flowing through wirings are hardly interlinked with the hall element. Therefore, the semiconductor magnetic sensor can accurately detect the magnetic flux density of the magnetic field applied from the outside.

DETAILED DESCRIPTION OF THE PREFERRED EMBODIMENTS

Hereinafter, embodiments of the present invention will be described with reference to the accompanying drawings.

First, a description is given of a structure of a semiconductor magnetic sensor having a hall element mounted therein.

Figure 1:
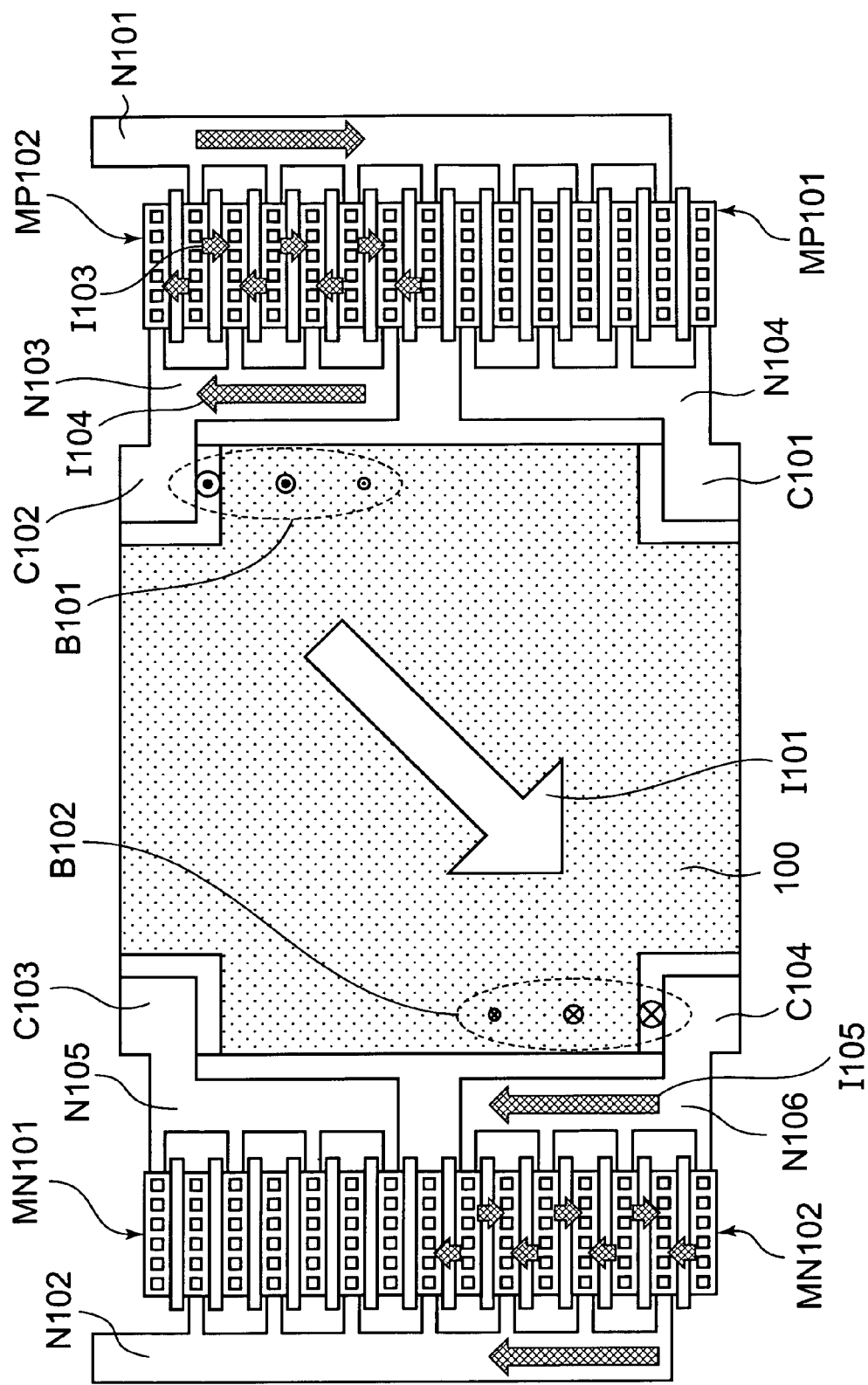
FIG. 1 is a plan view of a semiconductor magnetic sensor according an embodiment of the present invention.
Figure 2:
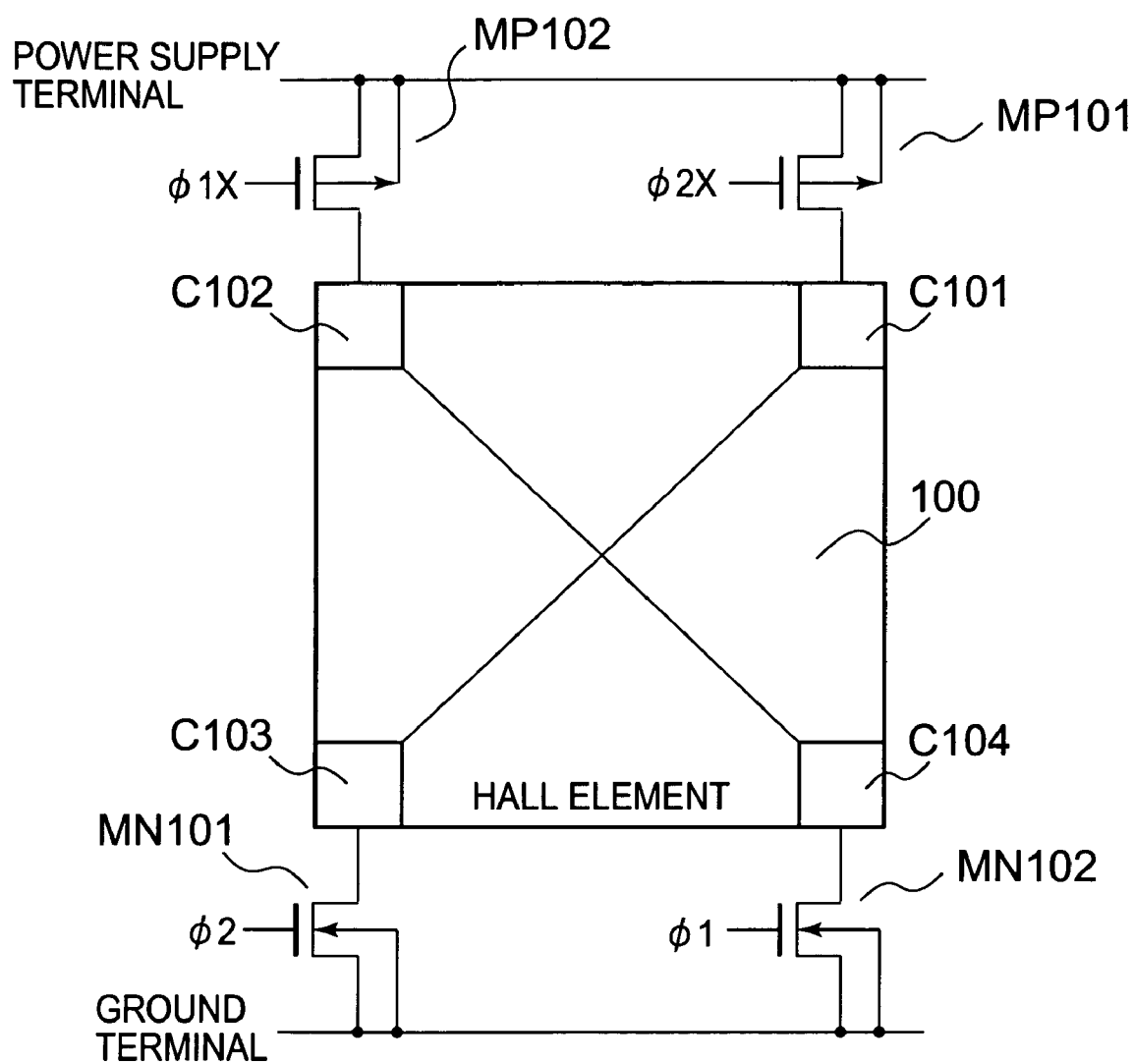
FIG. 2 is a circuit diagram of the semiconductor magnetic sensor.

FIG. 1 is a plan view of the semiconductor magnetic sensor.
FIG. 2 is a circuit diagram of the semiconductor magnetic sensor.

The semiconductor magnetic sensor includes p-type transistors MP101, p-type transistors MP102, n-type transistors MN101, n-type transistors MN102, and a hall element 100. The hall element 100 includes a terminal C101, a terminal C102, a terminal C103, and a terminal C104. In addition, the semiconductor magnetic sensor includes a logic circuit (not shown) and a sampling circuit (not shown).

The terminal C101 of the hall element 100 is connected to a drain of each of the transistors MP101 via a wiring N104. The terminal C102 of the hall element 100 is connected to a drain of each of the transistors MP102 via a wiring N103. The terminal C103 of the hall element 100 is connected to a drain of each of the transistors MN101 via a wiring N105. The terminal C104 of the hall element 100 is connected to a drain of each of the transistors MN102 via a wiring N106. A source of each of the transistors MP101 and the transistors MP102 is connected to a power supply terminal N101. A source of each of the transistors MN101 and the transistors MN102 is connected to a ground terminal N102. A gate of each of the transistors MP101, the transistors MP102, the transistors MN101, and the transistors MN102 is connected to the logic circuit mounted in the same semiconductor device. In addition, the terminal C101, the terminal C102, the terminal C103, and the terminal C104 are each connected to the sampling circuit mounted in the same semiconductor device.

The gates of the transistors MP101 are formed in a comb shape as shown in FIG. 1. The drain of each of the transistors MP101 is led out to a side of the hall element 100, and the source of each of the transistors M1 P101 is led out to an opposite side of the hall element 100. The wiring N104 connected to the drain of each of the transistors MP101 is positioned on the hall element 100 side, and the power supply terminal N101 connected to the source of each of the transistors MP101 is positioned on the opposite side of the hall element 100. The transistors MP102, the transistors MN101, and the transistors MN102 are structured in a similar manner.

The transistors MP101 are each formed on one side of the hall element 100, and the drain of each of the transistors MP101 is connected to the terminal C101 formed on the one side of the hall element 100. The transistors MP102 are also formed on the one side of the hall element 100, and the drain of each of the transistors MP102 is connected to the terminal C102 formed on the one side of the hall element 100. The transistors MN101 are each formed on another side opposite to the one side of the hall element 100, and the drain of each of the transistors MN101 is connected to the terminal C103 formed on the another side of the hall element 100. The transistors MN102 are also formed on the another side of the hall element 100, and the drain of each of the transistors MN102 is connected to the terminal C104 formed on the another side of the hall element 100.

Further, when the wiring N103 is rotated 180 degrees, the wiring N103 has completely the same shape as that of the wiring N106 in terms of mask layout. A positional relation between the wiring N103 and the hall element 100 is completely the same as a positional relation between the wiring N106 and the hall element 100 in terms of mask layout. When the wiring N104 is rotated 180 degrees, the wiring N104 has completely the same shape as that of the wiring N105 in terms of mask layout. A positional relation between the wiring N104 and the hall element 100 is completely the same as a positional relation between the wiring N105 and the hall element 100 in terms of mask layout. In other words, the drain of each of the transistors MN101 is connected to the terminal C103 via the wiring which has the same shape, in terms of mask layout, as that of the wiring connecting the drain of each of the transistors MP101 and the terminal C101 and which is rotated by 180 degrees. The drain of each of the transistors MN102 is connected to the terminal C104 via the wiring which has the same shape, in terms of mask layout, as that of the wiring connecting the drain of each of the transistors MP102 and the terminal C102 and which is rotated by 180 degrees.

The hall element 100 formed in a square shape or a rectangular shape performs magnetoelectric conversion to detect a magnetic flux density of a magnetic field of a magnet or the like, which is applied from an outside. The logic circuit outputs control signals for performing on/off control of each of the transistors MP101, the transistors MP102, the transistors MN101, and the transistors MN102 so as to change a current path in the hall element 100. The transistors MP101, the transistors MP102, the transistors MN101, and the transistors MN102 each drive the hall element 100. The sampling circuit includes a switching circuit (not shown), an amplifier (not shown), and a capacitor (not shown), and samples a voltage generated between the terminal C101 and the terminal C103 or a voltage generated between the terminal C102 and the terminal C104.

Figure 3:
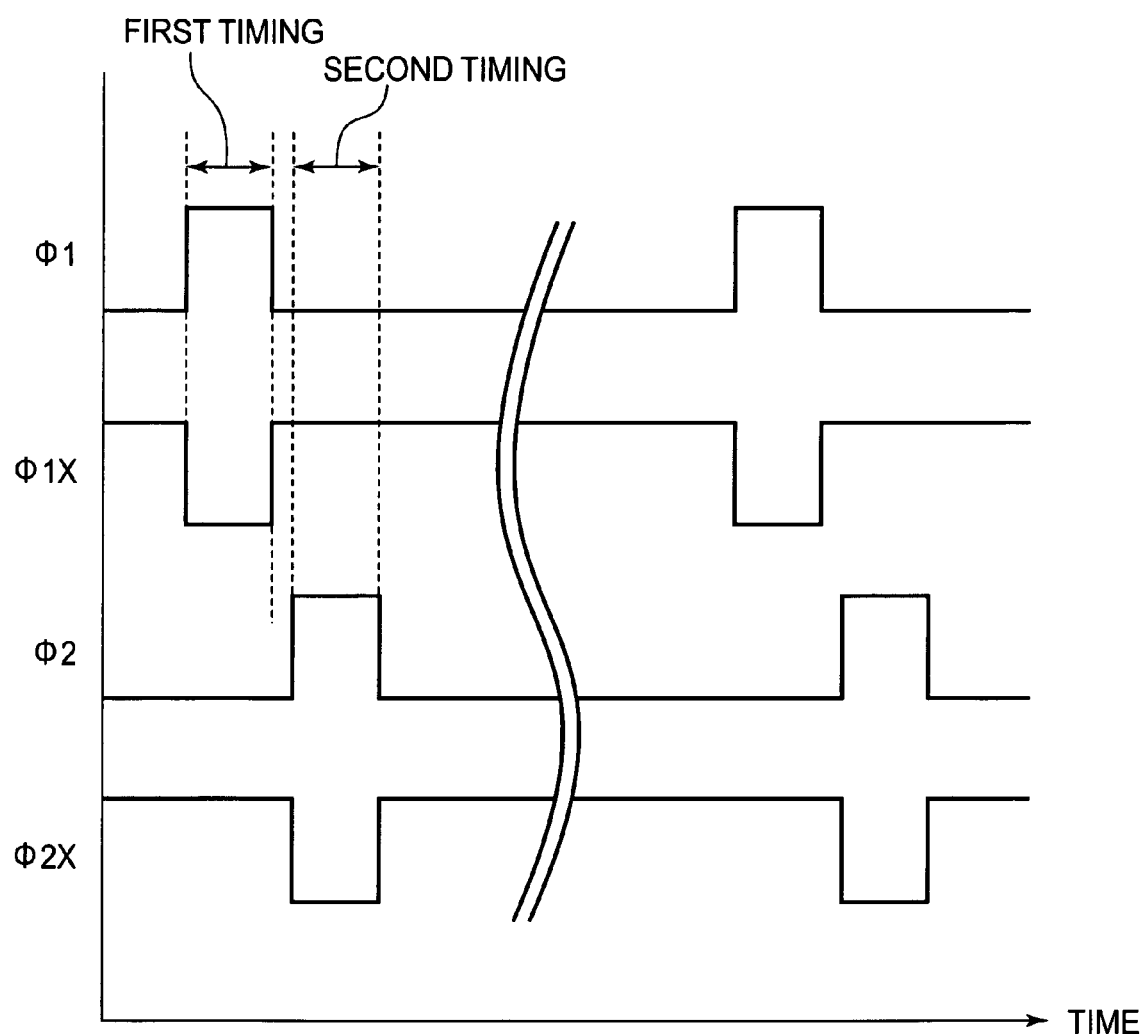
FIG. 3 is a timing chart of control signals.
Figure 4:
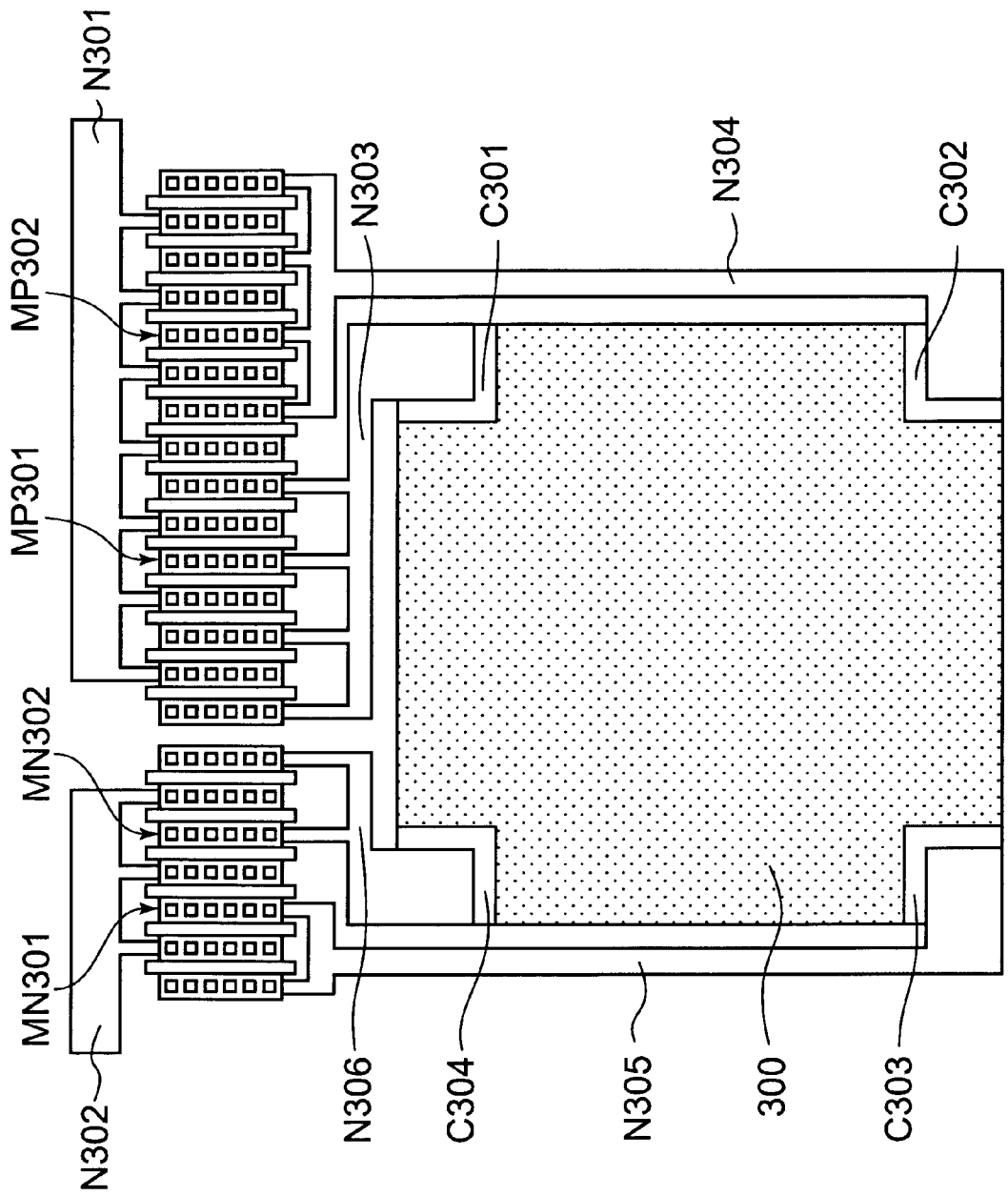
FIG. 4 is a plan view of a semiconductor magnetic sensor of a related art.

Next, a description is given of operations of the semiconductor magnetic sensor. FIG. 3 is a timing chart of the control signals.

In this case, the logic circuit outputs a control signal $\Phi 2X$ to each of the transistors MP101, outputs a control signal $\Phi 1X$ to each of the transistors MP102, outputs a control signal $\Phi 2$ to each of the transistors MN101, and outputs a control-signal $\Phi 1$ to each of the transistors MN102.

At a first timing, when the control signal $\Phi 1$ is at a high level and the control signal $\Phi 1X$ is at a low level, each of the transistors MN102 is turned on and each of the transistors MP102 is also turned on. As a result, a hall element drive current I101 flows from the terminal C102 of the hall element 100 to the terminal C104 thereof. At this time, a hall voltage corresponding to the hall element drive current I101 and the magnetic flux density of the magnetic field, which is applied from the outside and is interlinked with the hall element 100, is generated between the terminal C101 and the terminal C103. Then, the sampling circuit samples the hall voltage. At the first timing, the terminal C102 and the terminal C104 each function as a terminal for supplying the current, and the terminal C101 and the terminal C103 each function as a terminal for detecting the voltage.

In this case, when each of the transistors MP102 is turned on and a current I104 flows through the wiring N103, as shown in FIG. 1, a magnetic field B101 is generated in the hall element 100 due to the current I104. After that, when the hall element drive current I101 flows and a current I105 having a current value substantially the same as that of the current I104 flows through the wiring N106, a magnetic field B102 having an absolute value substantially the same as that of the electric field B101 is generated due to the current I105. The magnetic field B102 is directed in a direction opposite to a direction of the magnetic field B101.

Further, at a second timing, when the control signal $\Phi 2$ is at a high level and the control signal $\Phi 2X$ is at a low level, each of the transistors MN101 is turned on and each of the transistors MP101 is also turned on. As a result, a hall element drive current flows from the terminal C101 of the hall element 100 to the terminal C103 thereof. At this time, a hall voltage corresponding to the hall element drive current and the magnetic flux density of the magnetic field, which is applied from the outside and is interlinked with the hall element 100, is generated between the terminal C102 and the terminal C104.

Then, the sampling circuit samples the hall voltage. At the second timing, the terminal C101 and the terminal C103 each function as a terminal for supplying the current, and the terminal C102 and the terminal C104 each function as a terminal for detecting the voltage.

In such a structure, the gates of the transistors MP102 are, formed in a comb shape, and currents I103 flowing through the channels of the transistors MP102 flow from the sources or the drains thereof through the channels, which are formed immediately below the gates, in a geometrically symmetrical manner. In other words, a current flowing from the source or the drain through a channel immediately below one gate, and a current flowing through a channel immediately below another gate flow in opposite directions with the same amount. As a result, a magnetic field which is generated by the current flowing from the source or the drain through the channel immediately below one gate and which is interlinked with the hall element 100 is offset by a magnetic field which is generated by the current flowing through the channel immediately below the another gate and which is interlinked with the hall element 100. Accordingly, the semiconductor magnetic sensor can accurately detect the magnetic flux density of the magnetic field applied from the outside. The transistors MP101, the transistors MN101, and the transistors MN102 are structured in a similar manner.

Further, the magnetic field B101 is directed in a direction opposite to that of the magnetic field B102, and has the same absolute value as that of the magnetic field B102. Accordingly, the magnetic field which is generated by the current I104 flowing through the wiring N103 and interlinked with the hall element 100 is substantially offset by the magnetic field which is generated by the current I105 flowing through the wiring N106 and interlinked with the hall element 100. As a result, the semiconductor magnetic sensor can accurately detect the magnetic flux density of the magnetic field applied from the outside.

Further, as compared with a conventional case, the wiring connecting the drain of each of the transistors and the hall element 100 becomes short, whereby the magnetic field generated due to the current flowing through the wiring is hardly interlinked with the hall element 100. Accordingly, the semiconductor magnetic sensor can accurately detect the magnetic flux density of the magnetic field applied from the outside.

Further, a distance between the power supply terminal N101 or the ground terminal N102 and the hall element 100 is secured by the transistors. As a result, the magnetic field generated due to the current flowing through the power supply terminal N101 or the ground terminal N102 is hardly interlinked with the hall element 100. Therefore, the semiconductor magnetic sensor can accurately detect the magnetic flux density of the magnetic field applied from the outside.

Further, no wiring routed near the hall element 100 exists unlike the conventional case, with the result that an area of the semiconductor magnetic sensor is reduced.

Note that when a channel width of each of transistors is set larger, an on-resistance of each of the transistors becomes smaller correspondingly. For this reason, it is preferable that the channel width of each of the transistors MP101, the transistors MP102, the transistors MN101, and the transistors MN102 be set longer.

Further, when a space is provided between the wiring connected to the drain of each of the transistors and the hall element 100 so as to secure a distance therebetween, with the result that the magnetic field generated due to the current flowing through the wiring is hardly interlinked with the hall element 100. For this reason, the space therebetween may be provided.

Further, the semiconductor magnetic sensor according to the present invention may be applied to a magnetic sensor IC for detecting the magnetic flux density of the magnetic field applied from the outside to output a signal based on detection results.

Further, the semiconductor magnetic sensor according to the present invention may be applied to a magnetic sensor IC for detecting the magnetic flux density of the magnetic field applied from the outside to output an analog voltage based on detection results. In this case, the analog voltage to be output in a zero magnetic field approaches a zero level, and an output offset voltage is reduced.

Further, the semiconductor magnetic sensor according to the present invention may be applied to a magnetic switching IC for detecting the magnetic flux density of the magnetic field applied from the outside and comparing detection results with a threshold to thereby output a high level signal or a low level signal based on comparison results.

What is claimed is:

1. A semiconductor magnetic sensor for detecting a magnetic flux density of a magnetic field applied from an outside, comprising:
    a hall element formed in one of a square shape and a rectangular shape, for performing magnetoelectric conversion;
    a first transistor formed on a side of one side of the hall element, for driving the hall element, the first transistor having a drain connected to a first terminal formed on the one side of the hall element and having a source connected to a power supply terminal;
    a second transistor formed on the side of the one side of the hall element, for driving the hall element, the second transistor having a drain connected to a second terminal formed on the one side of the hall element and having a source connected to the power supply terminal;
    a third transistor formed on a side of another side opposite to the one side of the hall element, for driving the hall element, the third transistor having a drain connected to a third terminal formed on the another side of the hall element and having a source connected to a ground terminal; and
    a fourth transistor formed on the side of the another side of the hall element, for driving the hall element, the fourth transistor having a drain connected to a fourth terminal formed on the another side of the hall element and having a source connected to the ground terminal.

2. A semiconductor magnetic sensor according to claim 1, wherein:
    the drain of the third transistor is connected to the third terminal via a first wiring which has the same shape, in terms of mask layout, as that of a second wiring connecting the drain of the first transistor and the first terminal and rotated by 180 degrees; and
    the drain of the fourth transistor is connected to the fourth terminal via a third wiring which has the same shape, in terms of mask layout, as that of a fourth wiring connecting the drain of the second transistor and the second terminal and rotated by 180 degrees.

* * * * *